(12) United States Patent
Kim et al.

(10) Patent No.: US 7,934,967 B2
(45) Date of Patent: May 3, 2011

(54) METHOD OF MANUFACTURING ORGANIC LIGHT-EMITTING DEVICE AND ORGANIC LIGHT-EMITTING DEVICE MANUFACTURED USING THE METHOD

(75) Inventors: Yong-Tak Kim, Suwon-si (KR); Won-Jong Kim, Suwon-si (KR); Jin-Baek Choi, Suwon-si (KR); Jong-Hyuk Lee, Suwon-si (KR); Yoon-Hyeung Cho, Suwon-si (KR); Byoung-Duk Lee, Suwon-si (KR); Min-Ho Oh, Suwon-si (KR); So-Young Lee, Suwon-si (KR); Sun-Young Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 553 days.

(21) Appl. No.: 12/025,604

(22) Filed: Feb. 4, 2008

(65) Prior Publication Data

US 2008/0254703 A1    Oct. 16, 2008

(30) Foreign Application Priority Data

Apr. 10, 2007  (KR) .................. 10-2007-0035171

(51) Int. Cl.
*H01J 9/26* (2006.01)
(52) U.S. Cl. .......................................... 445/24; 313/504
(58) Field of Classification Search ............... 445/24–25
See application file for complete search history.

(56) References Cited

U.S. PATENT DOCUMENTS

| | | | |
|---|---|---|---|
| 5,870,162 A * | 2/1999 | Fujimori et al. | 349/143 |
| 7,667,173 B2 * | 2/2010 | Caubet et al. | 250/208.1 |
| 2003/0132446 A1 * | 7/2003 | Guenther et al. | 257/88 |

* cited by examiner

*Primary Examiner* — Anne M Hines
(74) *Attorney, Agent, or Firm* — Christie, Parker & Hale, LLP

(57) ABSTRACT

A method of manufacturing an organic light-emitting device, the method including: forming an anode; forming an intermediate layer comprising an emission layer on the anode; and forming a cathode on the intermediate layer, wherein the forming of the cathode comprises thermally depositing indium or indium oxide, with at least one of a metal or a metal oxide in plasma generated in a chamber to form a transparent conductive layer of indium oxide doped with the at least one of the metal or the metal oxide.

20 Claims, 3 Drawing Sheets

METHOD OF MANUFACTURING ORGANIC LIGHT-EMITTING DEVICE AND ORGANIC LIGHT-EMITTING DEVICE MANUFACTURED USING THE METHOD

CROSS-REFERENCE TO RELATED PATENT APPLICATION

This application claims priority to and the benefit of Korean Patent Application No. 10-2007-0035171, filed on Apr. 10, 2007, in the Korean Intellectual Property Office, the entire content of which is incorporated herein by reference.

BACKGROUND OF THE INVENTION

1. Field of the Invention

The present invention relates to a method of manufacturing an organic light-emitting device and an organic light-emitting device manufactured using the method, and, more particularly, the present invention relates to a method of manufacturing an organic light-emitting device exhibiting a high light-coupling efficiency, and an organic light-emitting device manufactured using the method.

2. Description of the Related Art

An organic light-emitting device includes an anode, a cathode facing the anode, and an intermediate layer (including an emission layer) positioned between the anode and the cathode. The emission layer of the intermediate layer generates light using holes derived from the anode and electrons derived from the cathode, and the light generated from the emission layer emitted through the anode or the cathode. Thus, an electrode through which light is emitted should have a high transmittance.

In methods of manufacturing organic light-emitting devices, a transparent electrode is formed of Indium Tin Oxide (ITO) or the like. That is, an anode is formed, an intermediate layer is formed on the anode, and a cathode is formed on the intermediate layer using ITO or the like. In organic light-emitting devices, manufactured using these methods, the cathode is formed using sputtering. An image of the cathode thus formed is shown in FIG. 1. However, when forming a cathode using sputtering, an intermediate layer disposed below the cathode can be damaged during the sputtering process. In order to solve this problem, a method of forming a cathode using thermal deposition has been proposed. However, when forming a cathode using a conventional thermal deposition process, the temperature of a substrate for manufacturing the organic light-emitting device reaches about 300° C. At such a high temperature environment, the intermediate layer may be damaged.

In order to solve this problem, a method of forming an anode using ITO or the like and forming a cathode as a reflective electrode on the anode has been proposed. Here, the anode is formed using sputtering, an intermediate layer is formed on the anode, and the reflective cathode is formed using deposition. However, in order to form the intermediate layer interposed between the anode and the cathode, a new material is required instead of a conventional intermediate layer forming material. The intermediate layer positioned between the anode and the cathode can include various suitable layers, such as an electron injection layer, an electron transport layer, a hole injection layer, a hole transport layer, and an emission layer. These layers are formed of materials having appropriate lowest unoccupied molecule orbital (LUMO) levels considering the work functions of the anode and the cathode. However, currently available intermediate layer forming materials are adapted for an anode formed as a reflective metal electrode and a cathode formed as a transparent electrode. Thus, in order to form an anode using ITO or the like, a new intermediate layer forming material needs to be developed, instead of a conventional intermediate layer forming material which is adapted for the work function of a reflective anode and the work function of a cathode formed of ITO or the like.

In view of this problem, a method of forming a cathode as a thin metal double layer, instead of as a transparent electrode, as illustrated in FIG. 2, has been proposed. Referring to FIG. 2, a cathode 20 is a double layer including an Mg layer 21 and an Ag layer 23. In this case, the cathode 20 can have a transmittance value as low as less than 50%, thus providing a relatively high reflectance. As a result, a micro-cavity structure is formed such that reflection repeatedly occurs between an anode 10 formed as a reflective electrode and the cathode 20. Thus, in order to prevent (or reduce) the destructive interference of light, a distance t of an intermediate layer 30 between the anode 10 and the cathode 20 must be controlled.

SUMMARY OF THE INVENTION

An aspect of an embodiment of the present invention is directed toward a method of manufacturing an organic light-emitting device exhibiting a high light-coupling efficiency by forming a transparent cathode having an absolute work function value similar to that of (or substantially the same as) a transparent cathode formed using a conventional sputtering process without damaging an intermediate layer included in the organic light-emitting device, and an organic light-emitting device manufactured using the method.

An embodiment of the present invention provides a method of manufacturing an organic light-emitting device. The method includes forming an anode, forming an intermediate layer including an emission layer on the anode, and forming a cathode on the intermediate layer, wherein the forming the cathode includes thermally depositing an indium oxide and at least one of a metal or a metal oxide in plasma generated in a chamber to form a transparent conductive layer in which the indium oxide is doped with the at least one of the metal or the metal oxide.

In one embodiment of the present invention, a metal source and an indium source are thermally deposited under an oxygen atmosphere to form the cathode.

In one embodiment of the present invention, a metal source and an indium oxide source are thermally deposited under an argon atmosphere to form the cathode.

In one embodiment of the present invention, a metal oxide source and an indium oxide source are thermally deposited under an argon atmosphere to form the cathode.

In one embodiment of the present invention, a metal oxide source and an indium source are thermally deposited under an oxygen atmosphere to form the cathode.

In one embodiment of the present invention, a metal oxide source and an indium oxide source are thermally deposited under an oxygen atmosphere to form the cathode.

In one embodiment of the present invention, a metal source and an indium source are thermally deposited under a mixed atmosphere of oxygen and argon to form the cathode.

In one embodiment of the present invention, a metal source and an indium oxide source are thermally deposited under a mixed atmosphere of oxygen and argon to form the cathode.

In one embodiment of the present invention, the at least one of the metal or the metal oxide used in the formation of the cathode is a material having a lower absolute work function value than that of the indium oxide.

In one embodiment of the present invention, the metal includes a material selected from the group consisting of ytterbium (Yb), calcium (Ca), magnesium (Mg), samarium (Sm), cesium (Cs), barium (Ba), strontium (Sr), yttrium (Y), lanthanum (La), and combination thereof.

In one embodiment of the present invention, the metal oxide includes a material selected from the group consisting of strontium oxide, calcium oxide, cesium oxide, barium oxide, yttrium oxide, lanthanum oxide, and combination thereof.

Another embodiment of the present invention provides an organic light-emitting device formed by utilizing a method including forming an anode, forming an intermediate layer including an emission layer on the anode, and forming a cathode on the intermediate layer, wherein, in the process of forming the cathode, there is a step that includes thermally depositing an indium oxide with at least one of a metal or a metal oxide in plasma generated in a chamber to form a transparent conductive layer in which the indium oxide is doped with the at least one of the metal or the metal oxide.

In one embodiment of the present invention, the transparent conductive layer includes both the metal and the metal oxide.

Another embodiment of the present invention provides a method of manufacturing an organic light-emitting device, the method includes forming an anode, forming an intermediate layer including an emission layer on the anode, and forming a cathode on the intermediate layer, wherein, in the process of forming the cathode, there is a step that includes thermally depositing a metal, a metal oxide, and an indium oxide in plasma generated in a chamber to form a transparent conductive layer in which the indium oxide is doped with the metal and the metal oxide.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
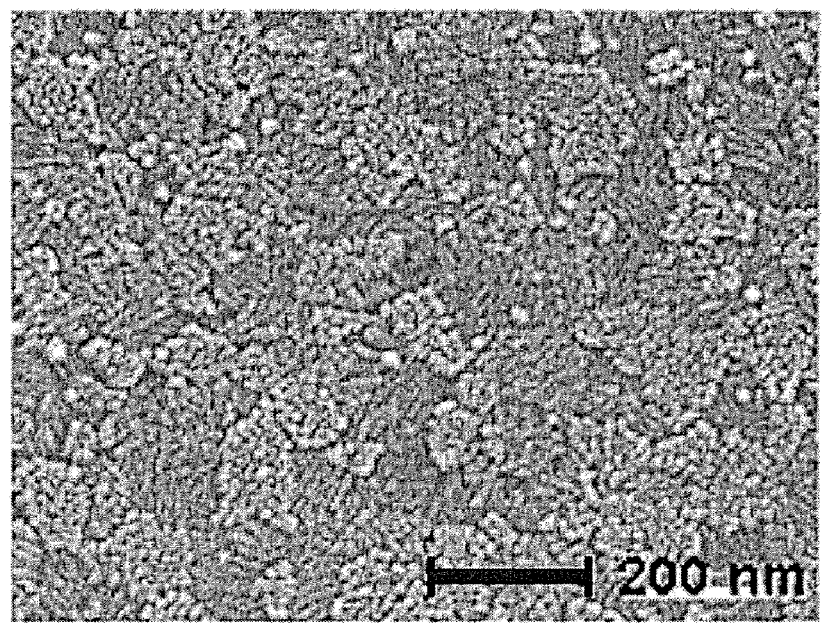
FIG. 1 is an image showing a cathode of an organic light-emitting device manufactured using a conventional method.
Figure 2:
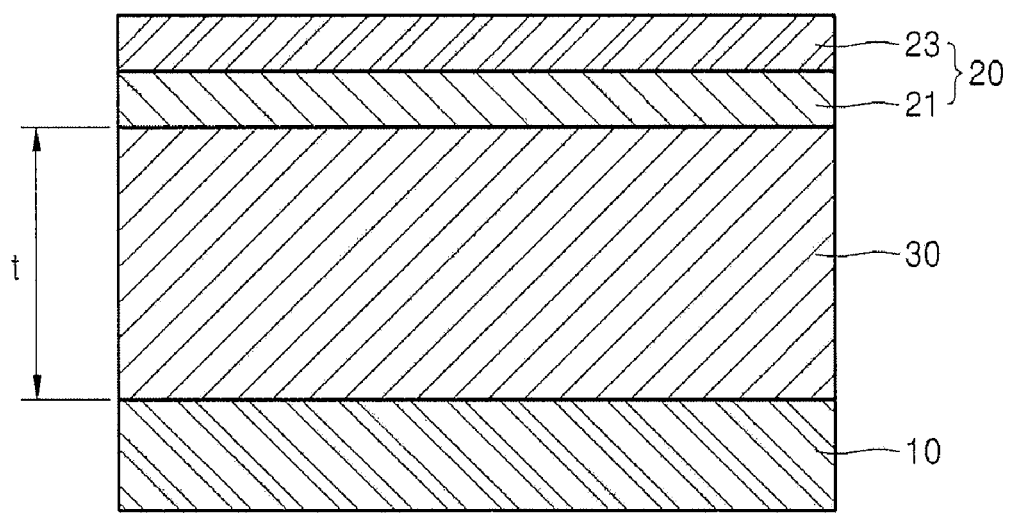
FIG. 2 is a schematic sectional view illustrating an organic light-emitting device manufactured using a conventional method.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Figure 3:
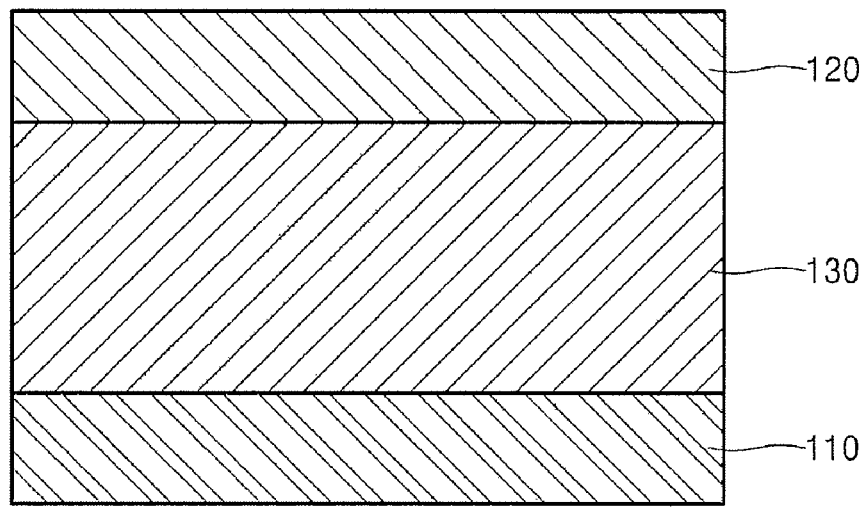
FIG. 3 is a schematic sectional view illustrating an organic light-emitting device manufactured using a method according to an embodiment of the present invention.

FIG. 3 is a schematic sectional view illustrating an organic light-emitting device manufactured using a method according to an embodiment of the present invention. Referring to FIG. 3, an anode 110 is formed, and an intermediate layer 130 including an emission layer is formed on the anode 110. A cathode 120 is formed on the intermediate layer 130.

The anode 110 may be formed to have various suitable structures. The anode 110 may include a reflective layer formed of Ag, Mg, Al, Pt, Pd, Au, Ni, Nd, Ir, and/or Cr, and a layer formed of ITO, IZO, ZnO, and/or $In_2O_3$ on the reflective layer. The anode 110 may be formed using various suitable methods, such as deposition and/or sputtering. That is, since the anode 110 is formed before forming the intermediate layer 130, the anode 110 can be formed using any of a variety of suitable methods.

The intermediate layer 130 may be formed of a low molecular weight material or a polymer material. When the intermediate layer 130 is formed of a low molecular weight material, a hole injection layer (HIL), a hole transport layer (HTL), an emission layer (EML), an electron transport layer (ETL), an electron injection layer (EIL), etc. may be formed as a single-layered structure or a multi-layered composite structure. A low molecular weight material may be selected from various suitable materials, including copper phthalocyanine (CuPc), N,N'-di(naphthalene-1-yl)-N,N'-diphenyl-benzidine (NPB), tris-8-hydroxyquinoline aluminum (Alq3), etc. These layers may be formed using vacuum deposition or the like.

When the intermediate layer 130 is formed of a polymer material, it may be generally structured to include an (HTL) and an EML. Here, the HTL may be formed of polyethylenedioxythiophene (PEDOT), and the EML may be formed of a polymer material, such as a polyphenylenevinylene (PPV)-based and/or polyfluorene-based material. These layers may be formed using screen printing, inkjet printing, or the like.

The cathode 120 is formed as a transparent conductive layer. In detail, the cathode 120 is a transparent conductive layer in which indium oxide is doped with a metal and/or a metal oxide. Conventionally, a cathode is formed as a transparent conductive layer using a sputtering process. In this case, an intermediate layer is damaged due to the characteristics of sputtering. Furthermore, when a cathode is formed using a conventional thermal deposition process, an intermediate layer is damaged due to a high temperature during the thermal deposition. However, according to an embodiment of the present invention, the cathode 120 is formed using a low-temperature thermal deposition process, thereby effectively preventing (or reducing) damage to the intermediate layer 130, and resulting in the manufacture of a high-quality organic light-emitting device.

When an electrode is formed using a conventional thermal deposition process, a temperature of a substrate for manufacturing an organic light-emitting device reaches about 300° C., thereby damaging an intermediate layer. According to an embodiment of the present invention, in order to lower a deposition temperature for forming the electrode, indium oxide and a metal or metal oxide are thermally deposited in a presence of plasma generated in a chamber for performing a deposition process. When the cathode 120 is formed in the presence of plasma generated in the chamber, a material for forming the cathode 120 is ionized, and thus, the deposition can be effectively performed without raising the deposition temperature. As such, when the cathode 120 is thermally deposited in the presence of plasma generated in the chamber, the temperature of a substrate is merely raised to about 100° C., thus effectively preventing (or reducing) damage to the intermediate layer 130. In addition, the thermal deposition of the cathode 120, in the presence of plasma generated in the chamber, can improve the mobility characteristics of the cathode 120, thereby remarkably lowering the resistance of the cathode 120.

In one embodiment, the cathode 120 is formed by thermal co-deposition of a metal and/or a metal oxide with indium oxide, instead of thermal deposition of only indium oxide. As described above, the intermediate layer 130 positioned between the anode 110 and the cathode 120 of the organic light-emitting device can include various suitable layers, such as an EIL, an ETL, an HIL, a HTL, an emission layer. These layers are formed of materials having appropriate LUMO levels considering the work functions of the anode 110 and the cathode 120. Thus, in order to utilize currently available intermediate layer forming materials, the work function of the cathode 120 should be similar to that of (or substantially the same as) a transparent cathode formed using a conventional sputtering process.

An absolute work function value of a transparent cathode formed using a conventional sputtering process is about 4.4 eV. On the other hand, when forming a cathode by thermally depositing only indium oxide in the presence of plasma generated in a chamber, an absolute work function value of the cathode is about 5.0 eV which is higher than 4.4 eV. Thus, according to an embodiment of the present invention, the cathode 120 is formed by thermally co-depositing a metal or metal oxide with indium oxide in order to lower the absolute work function value of the cathode 120. As such, when indium oxide and a metal or metal oxide are thermally co-deposited, the absolute work function value of the cathode 120 is about 4.4 eV which is substantially similar to that of a cathode formed using a conventional sputtering process. Thus, a currently available intermediate layer forming material can be utilized.

As described above, the cathode 120 can be formed by thermally co-depositing a metal and/or a metal oxide with indium oxide. The metal used herein may include at least one material selected from the group consisting of ytterbium (Yb), calcium (Ca), magnesium (Mg), samarium (Sm), cesium (Cs), barium (Ba), strontium (Sr), yttrium (Y), lanthanum (La), and combination thereof. The metal oxide used herein may include at least one material selected from the group consisting of strontium oxide, calcium oxide, cesium oxide, barium oxide, yttrium oxide, lanthanum oxide, and combination thereof. The metal and/or the metal oxide is a material having a lower absolute work function value than that of indium oxide. By thermally co-depositing indium oxide with a metal and/or a metal oxide having a lower absolute work function value than indium oxide, a transparent conductive layer in which the indium oxide is doped with the metal or the metal oxide is formed as the cathode 120. In this manner, the absolute work function value of the cathode 120 can be controlled to be similar to that of a cathode formed using a conventional sputtering process.

Figure 4:
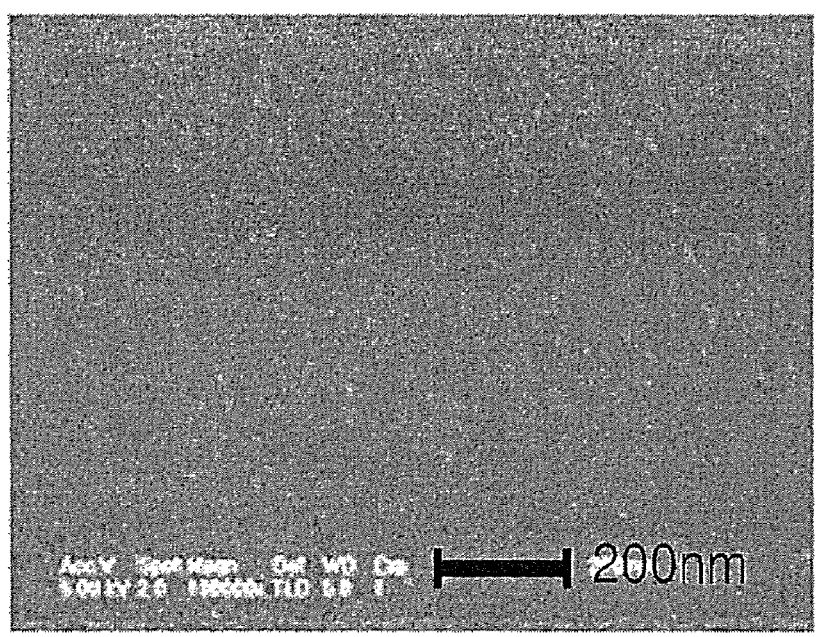
FIG. 4 is an image showing a cathode of an organic light-emitting device manufactured using a method according to an embodiment of the present invention.

FIG. 4 is an image showing a cathode prepared according to the above-described method. Referring to FIG. 4, the cathode exhibits smaller surface roughness and thus has a more uniform surface morphology as compared to the cathode formed using the conventional sputtering process (see FIG. 1).

Various suitable methods of forming a cathode with a transparent conductive layer in which indium oxide is doped with at least one of a metal or metal oxide can be employed using various suitable materials and/or under various suitable ionized atmospheres.

In one embodiment, a metal source and an indium source may be thermally deposited under an oxygen atmosphere. In this case, indium and the metal are respectively converted to indium oxide and metal oxide due to the oxygen atmosphere during the thermal deposition, thereby forming a cathode in which the indium oxide is doped with the metal oxide.

In another embodiment, a metal source and an indium oxide source may be thermally deposited under an argon atmosphere. Since argon is an inert gas that does not affect the composition of deposition materials, it is possible to form a cathode in which indium oxide is doped with a metal. Of course, a cathode in which indium oxide is doped with metal oxide may also be formed by thermally depositing a metal oxide source and an indium oxide source under an argon atmosphere.

In another embodiment, a cathode in which indium oxide is doped with metal oxide may be formed by thermally depositing a metal oxide source and an indium source under an oxygen atmosphere. In this case, during the deposition, indium is oxidized to indium oxide, and doped with the provided metal oxide.

In another embodiment, a cathode in which indium oxide is doped with metal oxide can also be formed by thermally depositing a metal oxide source and an indium oxide source under an oxygen atmosphere. In this case, oxygen is plasmatized by an ion gun or the like, thus lowering the deposition temperature, leading to a reduction in resistance of the cathode.

In another embodiment, a cathode may be formed by thermally depositing a metal source and an indium source under a mixed atmosphere of oxygen and argon. In yet another embodiment a cathode may be formed by thermally depositing a metal source and an indium oxide source under a mixed atmosphere of oxygen and argon.

Cathodes, in each of which indium oxide is doped with calcium (e.g., calcium metal), were manufactured according to the above-described method, and the characteristics of the cathodes doped with indium oxide according to the methods described above are presented in Table 1 below.

TABLE 1

| Film thickness (Å) | Resistance (Ωcm) | Substrate temperature (°C.) | Transmittance (%) | | | \|Work function\| (eV) |
|---|---|---|---|---|---|---|
| | | | Blue light | Green light | Red light | |
| 900 | $6.5 \times 10^{-4}$ | 80 | 90 | 85 | 84 | 4.4 |
| 800 | $7.2 \times 10^{-4}$ | 80 | 88 | 84 | 85 | 4.4 |
| 770 | $4.3 \times 10^{-4}$ | 80 | 89 | 85 | 85 | 4.4 |
| 730 | $3.9 \times 10^{-4}$ | 80 | 98 | 85 | 86 | 4.4 |

As can be seen from Table 1, in the formation of a cathode, a substrate temperature is only raised to 80° C., thus effectively preventing (or reducing) damage to an intermediate layer. Such low operating temperature poses an advantage over conventional thermal deposition processes. Further, since sputtering is not involved in the formation of the cathode, damage to the intermediate layer is reduced (or prevented) during the cathode formation process. Accordingly, the resistance of a cathode manufactured by an embodiment of the present invention is only in an order of $10^{-4}$ Ωcm, thus inducing high conductivity. Also, the absolute work function value of the cathode is 4.4 eV, which is similar to that of a cathode formed using the conventional sputtering process. In addition, the transmittance of a cathode for blue, green, and red light is as high as 85% or more, which is higher than that of a cathode having a double metal layer using the conventional method. It is therefore feasible to manufacture an organic light-emitting device without considering a distance between the anode and the cathode, thus simplifying the manufacturing process.

Figure 5:
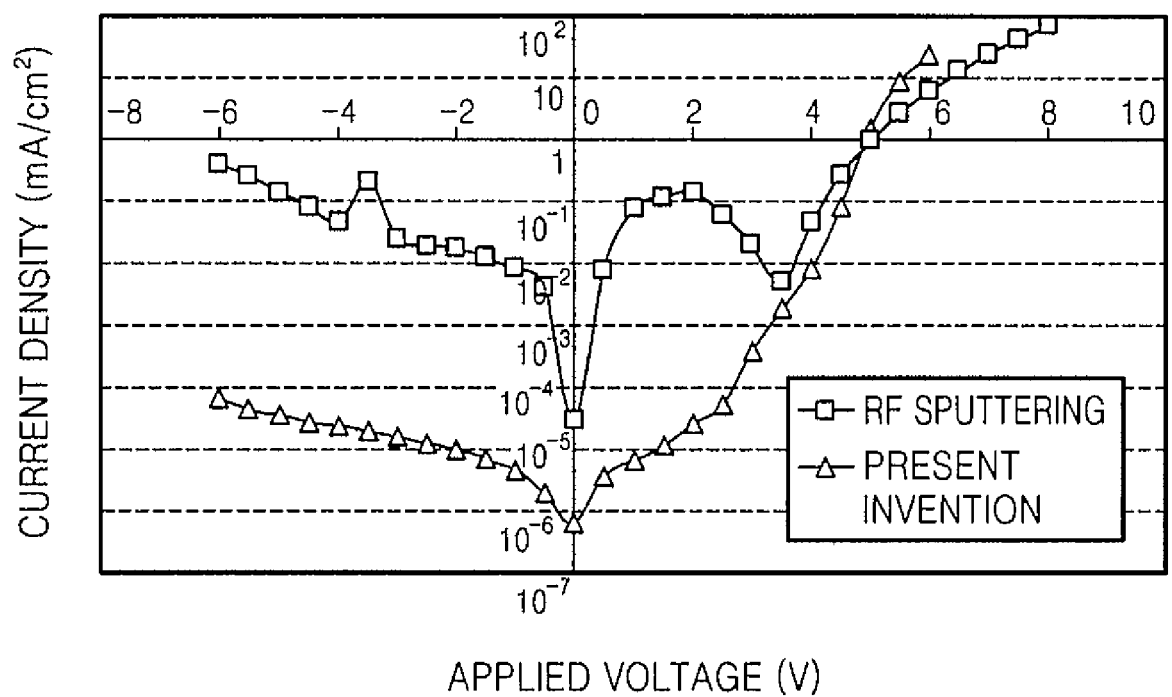
FIG. 5 is a comparative graph illustrating electrical characteristics of organic light-emitting devices manufactured using a conventional method and a method according an embodiment of the present invention.

FIG. 5 is a comparative graph illustrating electrical characteristics of organic light-emitting devices manufactured using a conventional method and a method according an embodiment of the present invention. In detail, FIG. 5 illustrates a change in current density (ordinate axis) with respect to an applied voltage (abscissa axis) for an organic light-emitting device with a cathode formed using a conventional sputtering process and an organic light-emitting device with a cathode formed using a method according to an embodiment of the present invention.

As can be seen in FIG. 5, the organic light-emitting device with the cathode formed using the conventional sputtering process has a higher leakage current due to damage to an intermediate layer, incurred during formation of the cathode. The leakage current was caused by a reverse bias voltage when it was applied to the organic light-emitting device. By contrast, the organic light-emitting device with the cathode manufactured according to the embodiment of the present invention has little leakage current ($10^{-5}$ mA). This is possible because there was no damage (or substantially no damage incurred) to an intermediate layer during a cathode formation process.

The method of manufacturing the organic light-emitting device according to an embodiment of the present invention has been illustrated in terms of formation of a cathode in which indium oxide is doped with either a metal or a metal oxide, or both.

In one embodiment, a cathode in which indium oxide is doped with a metal and a metal oxide may be formed by thermally depositing a metal source, a metal oxide source, and an indium oxide source under an argon atmosphere.

In another embodiment, a cathode in which indium oxide is doped with a metal and metal oxide may also be formed by thermally depositing a metal source and an indium source under an oxygen atmosphere. In this case, indium and some metals are oxidized to indium oxide and metal oxide, and they are then deposited onto a substrate. Some other metals that are not oxidized are also deposited onto the substrate to form the cathode, but in a metal form.

In another embodiment, a cathode in which indium oxide is doped with a metal and metal oxide may also be formed by thermally depositing a metal source and an indium oxide source under an oxygen atmosphere. In this case, some metals are oxidized to metal oxide, and the metal oxide is deposited. Some other metals are not oxidized and deposited in a metal state. Neither the source material nor the deposition atmosphere employed is limited to the ones described above. That is, a cathode in which indium oxide is doped with a metal and a metal oxide may be formed by thermally depositing a metal source and an indium source under a mixed atmosphere of oxygen and argon. In one embodiment, a cathode is formed by thermally depositing a metal source and an indium oxide source under a mixed atmosphere of oxygen and argon. In another embodiment, a cathode is formed by thermally depositing a metal source, a metal oxide source, and an indium oxide source under a mixed atmosphere of oxygen and argon.

According to an embodiment of the present invention, a transparent cathode having an absolute work function value similar to that of a transparent cathode formed using a conventional sputtering process can be formed without damaging an intermediate layer of the organic light-emitting device, thereby improving the light-coupling efficiency of the organic light-emitting device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light-emitting device, the method comprising:
   forming an anode;
   forming an intermediate layer comprising an emission layer on the anode; and
   forming a cathode on the intermediate layer,
   wherein the forming the cathode comprises thermally depositing an indium oxide and at least one of a metal or a metal oxide in plasma generated in a chamber to form a transparent conductive layer in which the indium oxide is doped with the at least one of the metal or the metal oxide; and
   wherein the at least one of the metal or the metal oxide is a material having a lower absolute work function value than that of the indium oxide.

2. The method of claim 1, wherein, in the forming the cathode, a metal source and an indium source are thermally deposited under an oxygen atmosphere.

3. The method of claim 1, wherein, in the forming the cathode, a metal source and an indium oxide source are thermally deposited under an argon atmosphere.

4. The method of claim 1, wherein, in the forming the cathode, a metal oxide source and an indium oxide source are thermally deposited under an argon atmosphere.

5. The method of claim 1, wherein, in the forming the cathode, a metal oxide source and an indium source are thermally deposited under an oxygen atmosphere.

6. The method of claim 1, wherein, in the forming the cathode, a metal oxide source and an indium oxide source are thermally deposited under an oxygen atmosphere.

7. The method of claim 1, wherein, in the foaming the cathode, a metal source and an indium source are thermally deposited under a mixed atmosphere of oxygen and argon.

8. The method of claim 1, wherein, in the forming the cathode, a metal source and an indium oxide source are thermally deposited under a mixed atmosphere of oxygen and argon.

9. The method of claim 1, wherein the at least one of the metal or the metal oxide comprises a metal selected from the group consisting of ytterbium (Yb), calcium (Ca), magnesium (Mg), samarium (Sm), cesium (Cs), barium (Ba), strontium (Sr), yttrium (Y), lanthanum (La), and combination thereof.

10. The method of claim 1, wherein the at least one of the metal or the metal oxide comprises a metal oxide selected from the group consisting of strontium oxide, calcium oxide, cesium oxide, barium oxide, yttrium oxide, lanthanum oxide, and combination thereof.

11. A method of manufacturing an organic light-emitting device, the method comprising:
   forming an anode;
   forming an intermediate layer comprising an emission layer on the anode; and
   forming a cathode on the intermediate layer,
   wherein the forming the cathode comprises thermally depositing a metal, a metal oxide, and an indium oxide in plasma generated in a chamber to form a transparent conductive layer in which the indium oxide is doped with the metal and the metal oxide.

12. The method of claim 11, wherein, in the forming the cathode, a metal source, a metal oxide source, and an indium oxide source are thermally deposited under an argon atmosphere.

13. The method of claim 11, wherein, in the forming the cathode, a metal source and an indium source are thermally deposited under an oxygen atmosphere.

14. The method of claim 11, wherein, in the forming the cathode, a metal source and an indium oxide source are thermally deposited under an oxygen atmosphere.

15. The method of claim 11, wherein, in the forming the cathode, a metal source and an indium source are thermally deposited under a mixed atmosphere of oxygen and argon.

16. The method of claim 11, wherein, in the forming the cathode, a metal source and an indium oxide source are thermally deposited under a mixed atmosphere of oxygen and argon.

17. The method of claim 11, wherein, in the forming the cathode, a metal source, a metal oxide source, and an indium oxide source are thermally deposited under a mixed atmosphere of oxygen and argon.

18. The method of claim 11, wherein each of the metal and the metal oxide is a material having a lower absolute work function value than that of the indium oxide.

19. The method of claim 11, wherein the metal comprises a material selected from the group consisting of ytterbium (Yb), calcium (Ca), magnesium (Mg), samarium (Sm), cesium (Cs), barium (Ba), strontium (Sr), yttrium (Y), lanthanum (La), and combinations thereof.

20. The method of claim 11, wherein the metal oxide comprises a material selected from the group consisting of strontium oxide, calcium oxide, cesium oxide, barium oxide, yttrium oxide, lanthanum oxide, and combinations thereof.

* * * * *

UNITED STATES PATENT AND TRADEMARK OFFICE
CERTIFICATE OF CORRECTION

PATENT NO. : 7,934,967 B2  Page 1 of 1
APPLICATION NO. : 12/025604
DATED : May 3, 2011
INVENTOR(S) : Kim et al.

It is certified that error appears in the above-identified patent and that said Letters Patent is hereby corrected as shown below:

In the Claims

Column 8, Claim 7, line 39          Delete "foaming" Insert -- forming --

Signed and Sealed this
Tenth Day of April, 2012

David J. Kappos
*Director of the United States Patent and Trademark Office*